United States Patent [19]

Hechtman

[11] Patent Number: 4,574,236

[45] Date of Patent: Mar. 4, 1986

[54] HIGH FREQUENCY TEST FIXTURE

[75] Inventor: Charles D. Hechtman, Plainsboro, N.J.

[73] Assignee: AT&T Technologies, Inc., Berkeley Heights, N.J.

[21] Appl. No.: 546,221

[22] Filed: Oct. 27, 1983

[51] Int. Cl.[4] .......................................... G01R 31/02
[52] U.S. Cl. ........................ 324/158 F; 324/73 PC; 324/158 P
[58] Field of Search ........... 324/158 F, 158 P, 73 PC, 324/72.5

[56] References Cited

U.S. PATENT DOCUMENTS

| 3,249,818 | 5/1966 | Hwang et al. | 324/158 F |
|---|---|---|---|
| 3,963,986 | 6/1976 | Morton et al. | 324/158 F |
| 4,132,948 | 1/1979 | Katz | 324/158 F |
| 4,138,643 | 2/1979 | Beck et al. | 324/158 F |
| 4,289,367 | 9/1981 | Everett | 324/158 P X |
| 4,352,061 | 9/1982 | Matrone | 324/158 F |
| 4,357,062 | 11/1982 | Everett | 324/158 F X |

FOREIGN PATENT DOCUMENTS 2051052  4/1972  Fed. Rep. of Germany .

OTHER PUBLICATIONS

Valentine, E. et al., "Conductive Epoxy Encapsulated Wafer Probe", IBM Tech. Disc. Bull., vol. 20, No. 11B, Apr. 1978, pp. 4797–4798.
IBM Technical Disclosure Bulletin, vol. 21, No. 4, "Automatic Test Equipment Translator Board", Burbank, K., et al., Sep. 1978, pp. 1404–1405.
IBM Technical Disclosure Bulletin, vol. 18, No. 3, "High-Performance AC Chip Contactor", Morton, R., et al., Aug. 1975, pp. 749–750.
Catalog from Augat Pylon of Attleboro Mass. "Instructions for Finishing Pylon Flip-Top Fixtures", Apr. 1982.

Primary Examiner—Stewart J. Levy
Assistant Examiner—Stephen M. Baker
Attorney, Agent, or Firm—M. M. dePicciotto; R. B. Levy

[57] ABSTRACT

A high frequency test fixture (90) comprises a plurality of double-sided spring-loaded backdriving pins (99) positioned between a circuit board under test (41) and a stripline board (91) connected to an electronic tester. The double-sided backdriving pins (99) are located within through holes (98) of a ground plane (94) interposed between the circuit board (41) and the stripline (91). The top and bottom surfaces (96, 97) of the ground plane (94), respectively facing the circuit board (41) and the stripline board (91), are coated with an insulating material (68, 69). A plurality of pairs of spring-loaded ground pins (109, 111) are located in the ground plane (94) adjacent to the backdriving pins (99). In order to substantially reduce the inductance of the loop formed by the stripline board (91), a pair of backdriving pins (99), the circuit board (41) and a pair of ground pins (109, 111), the latter are separated thereby forcing a high frequency current path along the outside perimeter of the ground plane (94) instead of across the ground pins of one pair (FIG. 4).

22 Claims, 7 Drawing Figures

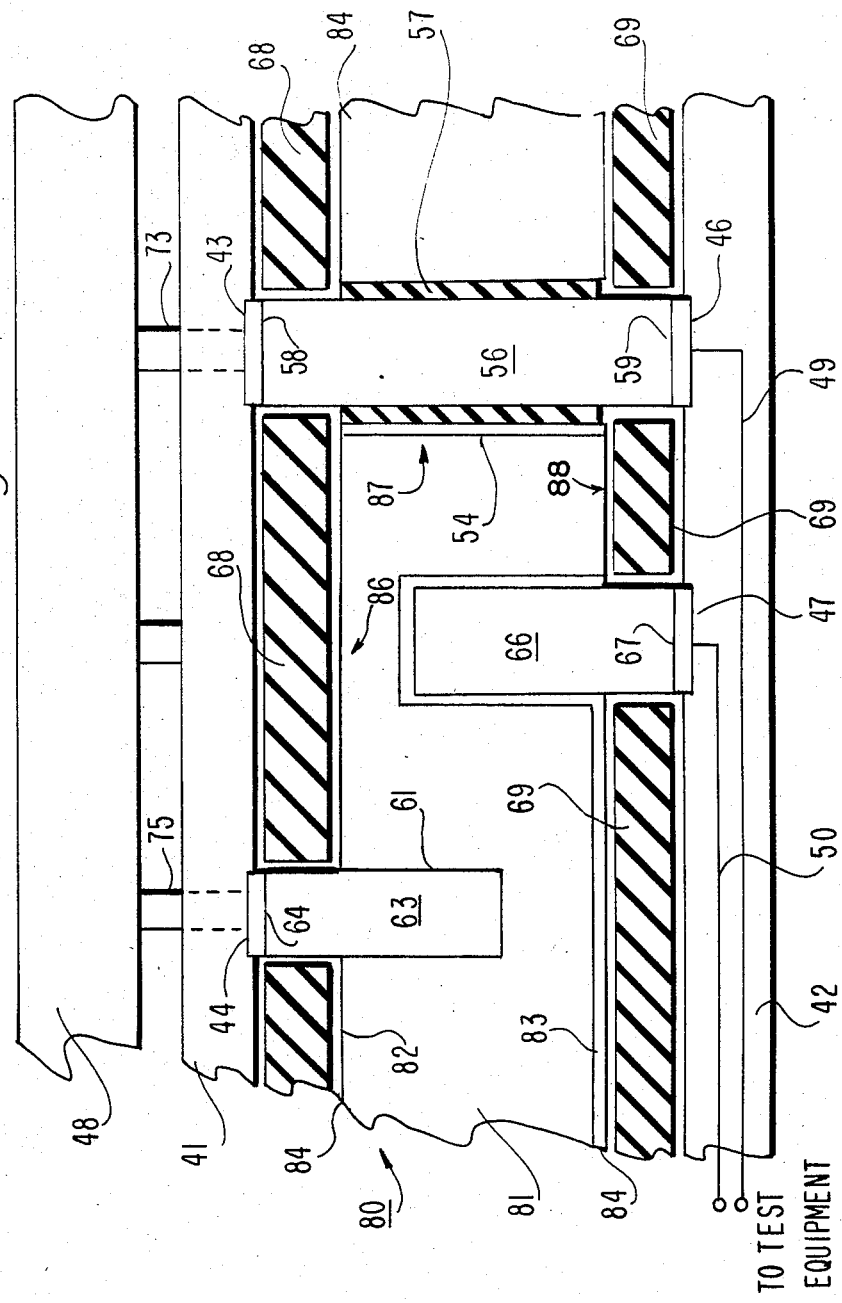

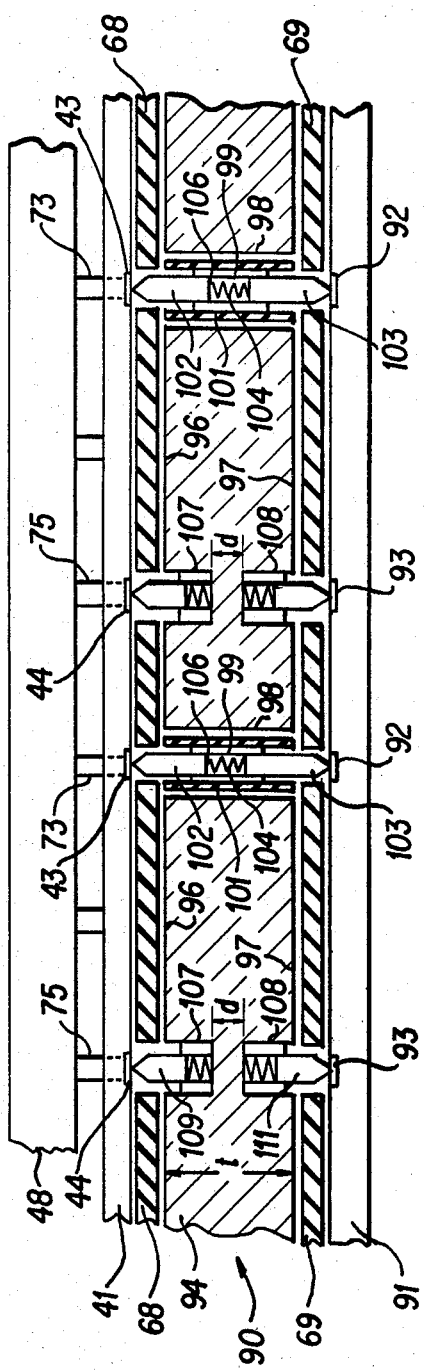

HIGH FREQUENCY TEST FIXTURE

TECHNICAL FIELD

The present invention relates to test fixtures for testing electrical circuits, and more particularly, to high frequency in-circuit test fixtures.

BACKGROUND OF THE INVENTION

In the field of electronic testing and diagnosis of defects in circuit boards, it is necessary to effect electronic probe contact with components on the circuit board under test. One type of known testing technique makes use of the edge connections of the board as probing contacts for the various components thereof. Such a technique requires diagnostic iteration through a series of time consuming excitation and response tests to identify the location of faults in the circuit board under test.

Another type of known testing technique, specifically directed to avoid the foregoing iterative testing processes, uses the so-called "bed of nails" test fixture wherein an array of contact pins mounted through a perforated platform is arranged to contact the plated side of the circuit board. As shown, for example, in the German Offenlegungsschrift No. 2051052, an array of double-ended spring-loaded pins is positioned between the plated side of a board under test and a plurality of electrically conducting leads coupling the pins to an electronic test equipment.

As the operating speed of logic components increases, electronic testers must have the capability of testing circuit boards at higher frequencies. The proper design of a test fixture which provides the interface between an electronic tester and a circuit board becomes critical to achieve reliable test results. Traditional test fixtures using straight or twisted pair wires connecting a bed of nails to the electronic test equipment may generate crosstalk, ground noise and ringing effects. These deleterious effects are most prevalent at high frequencies. Furthermore, the effective lead inductance associated with the wiring can become problematic during in-circuit testing. Using double-ended spring-loaded backdriving and ground pins in combination with a stripline board does not, of itself, reduce the inductance of the circuit formed by the pins and the boards. Therefore, there exists a need for a high frequency fixture which reduces noise and decreases the effective lead inductance of the transmission medium used.

SUMMARY OF THE INVENTION

The foregoing need is met in an embodiment of the invention wherein a test fixture comprises a support body having first and second substantially parallel major surfaces, a double-ended probe held by the support body between the first and second major surfaces thereof, a first probing element located on the first major surface and positioned proximate to one end of the double-ended probe, a second probing element located on the second major surface and positioned proximate to the other end of the double-ended probe, and means for forming a transmission loop in the support body between the first and the second probing element.

In an illustrative embodiment of the present invention, a test fixture comprises a support body having first and second substantially parallel major surfaces; an array of double-ended probes held by the support body between the first and second major surfaces thereof; a plurality of first probing elements located on the first major surface and positioned proximate to one end of the double-ended probes; a plurality of second probing elements located on the second major surface and positioned proximate to the other end of the double-ended probes; and means for forming a plurality of transmission loops in the support body between the first and the second probing elements.

In accordance with one embodiment of the invention, the support body comprises an electrically conducting body with the probing elements held in cavities formed therein such that a transmission loop between a first and a second probing element comprises serially-connected conducting sections of the planar body proximate to its two major surfaces and proximate to a double-ended probe.

In accordance with another embodiment of the invention, the support body comprises a planar body made of insulating material with a plurality of cavities and apertures formed therein. An electrically conductive layer is deposited on the two major surfaces of the body and on the walls of the cavities and the apertures. A transmission loop coupling the first probing element to the second probing element includes serially-connected conductive sections of the electrically conductive layer proximate to the two major surfaces of the support body and proximate to a double-ended probe.

In a preferred embodiment of the invention, the test fixture comprises an electrically conducting planar body having a first and a second major surface; an array of double-ended spring-loaded test pins held in apertures through the planar body and extending between the first and the second major surface thereof; a first plurality of spring-loaded test pins positioned in first cavities formed in the first major surface of the planar body; a second plurality of spring-loaded test pins positioned in second cavities formed in the second major surface of the planar body in substantial axial alignment with said first cavities, the first and second cavities having a combined depth smaller than the thickness of the planar body between its two major surfaces such that a plurality of electrically conductive transmission loops are formed in the planar body between the first and the second spring-loaded test pins.

BRIEF DESCRIPTION OF THE DRAWINGS

FIG. 3 shows a portion of a test fixture in accordance with another embodiment of the present invention;

FIG. 4a shows a test fixture of the type illustrated in FIG. 4 having an array of single and double-ended pins.

DETAILED DESCRIPTION

Figure 1:
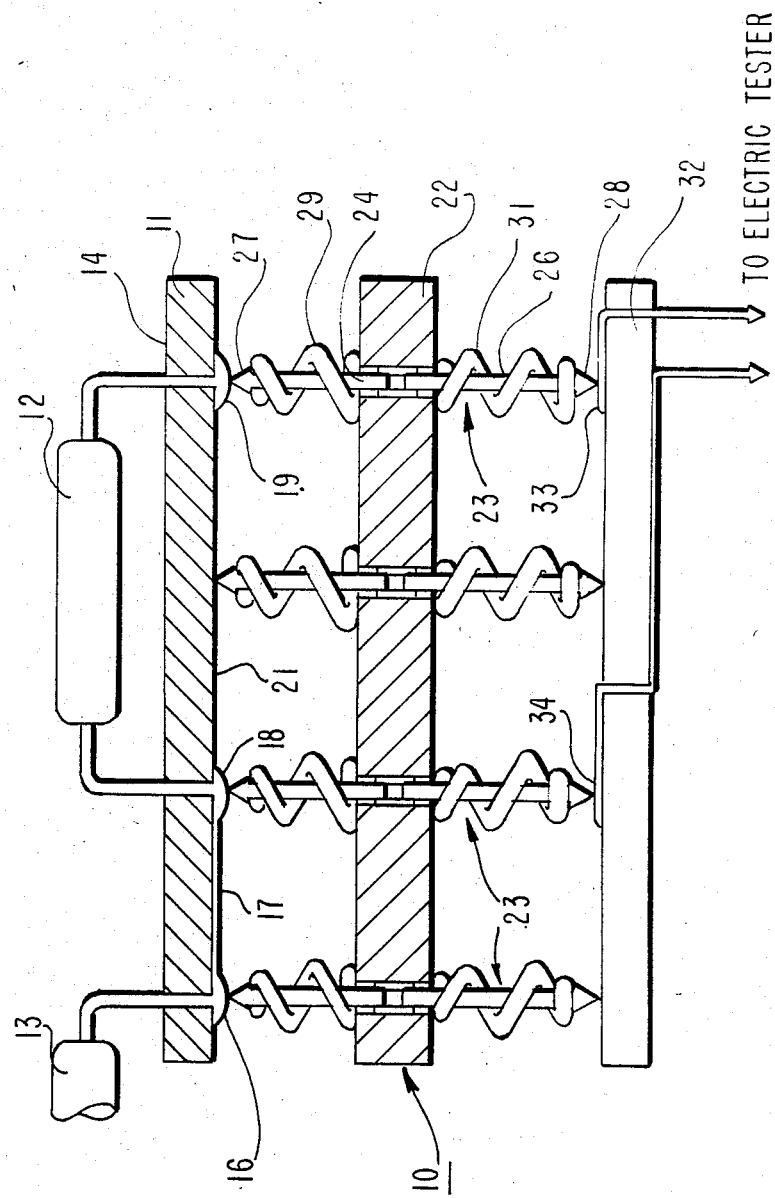
FIG. 1 schematically illustrates a known bed of nails test fixture.

Shown in FIG. 1 is a known test fixture 10 (see e.g., German Offenlegungsschrift No. 2051052) for testing a circuit board 11 having a plurality of electrical components 12,13 mounted on the components side 14 thereof.

Electrical contacts and connections 16, 17, 18 and 19 to the components 12 and 13 are made on the plated side 21 of the circuit board 11. The test fixture 10 comprises a plate 22 made of insulating material, and an array of double-ended spring-loaded pins 23 mounted through the plate 22 and extending on both sides away therefrom. As illustratively shown, each double-ended pin 23 comprises two electrically coupled stems 24 and 26, positioned in alignment with each other, and two pointed tips 27 and 28 respectively located at one end of the stems 24 and 26.

As shown, two springs 29 and 31, respectively located around the stems 24 and 26, are positioned between the plate 22 and the pointed tips 27 and 28. One set of pointed tips (e.g., 27) of the array of double-ended pins 23 is adapted to physically contact the electrical terminations and contacts 16 and 19 of the circuit board 11 on the plated side 21 thereof. The other set of pointed tips (e.g., 28) of the array of double-ended pins 23 is adapted to physically contact a connecting board 32 having a plurality of electrically conducting paths 33 and 34 on the surface thereof. The conducting paths 33 and 34 are connected to an electronic tester (not shown) thereby enabling the testing of the electrical component 12 of the circuit board 11.

Figure 2:
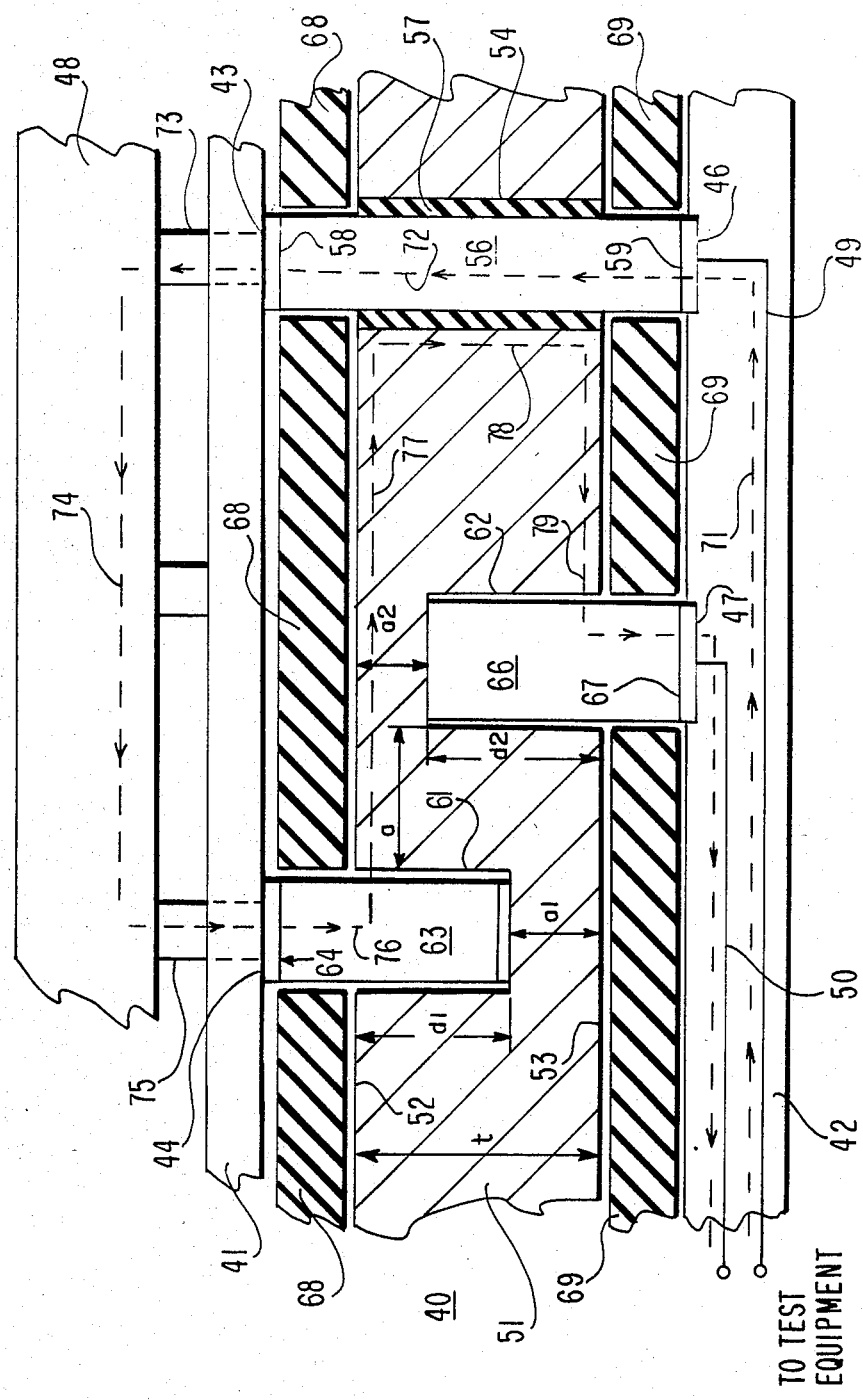
FIG. 2 shows a portion of a test fixture in accordance with one embodiment of the present invention.

Referring now to FIG. 2 wherein, for purpose of illustration only, a cross-sectional view of a small portion of a test fixture 40 in accordance with one embodiment of the invention is shown at a substantially enlarged scale. Typically, the test fixture 40 would be interposed between a circuit board 41 to be tested and a connecting board 42 coupled to an electronic test equipment (not shown). As shown in FIG. 2, the test fixture 40 is used as an electrical interface to establish electrical connections between test points (e.g., 43 and 44) of the circuit board 41 under test and electrical terminations (e.g., 46 and 47) of the connecting board 42. The test points 43 and 44 correspond to electrical contacts of component 48 mounted on the circuit board 41, and the terminations 46 and 47 are connected to a test equipment (not shown) as schematically illustrated by lines 49 and 50.

The test fixture 40 comprises a support body 51 having a pair of substantially parallel major surfaces 52 and 53. The support body 51, which is positioned between the circuit board 41 and the connecting board 42, is preferably a planar body having dimensions of its two major surfaces 52 and 53 comparable to or larger those those of the boards 41 and 42.

The support body 51 comprises an array of apertures 54 extending between its two major surfaces 52 and 53. For purpose of illustration only and in order to better understand the teachings of the present invention, only one aperture 54 of the array of apertures is shown in FIG. 2. The aperture 54 is adapted to receive and hold therein a double-ended electrically conducting probe 56 which is part of an array of probes of the test fixture 40. In accordance with one embodiment of the invention, the support body 51 is also made of an electrically conducting material. A spacer 57, made of insulating material, is inserted in the aperture 54 to isolate the probe 56 from the conducting support body 51. The double-ended probe 56 includes an elongated cylindrical member having one end 58 adapted to contact the test point 43 of the circuit board 41 and the other end 59 adapted to contact the electrical termination 46 of the connecting board 42. The double-ended probe 56 may be made of metal, or of an alloy, or of electrically conducting metal-filled polymer materials.

The support body 51 further comprises a set of first cavities 61 formed in its major surface 52 and a set of second cavities 62 formed in its other major surface 53. As mentioned in connection with the array of apertures 54, only one cavity of each set of first and second cavities is shown in FIG. 2. However, it should be understood that the support body 51 in accordance with an illustrative embodiment of the invention comprises an array of cavities 61 and 62 formed therein. In accordance with the present invention, the cavities 61 and 62 have respective depths $d_1$ and $d_2$ smaller than the thickness, t, of the support body 51. In other words, the cavities 61 and 62 do not extend through the entire thickness, t, of the support body 51 but are maintained at predetermined distances $a_1$ and $a_2$, respectively, from the major surfaces 53 and 52. Furthermore, as shown in FIG. 2, the first cavity 61 is spaced from the second cavity 62 by a distance a. The three distances a, $a_1$ and $a_2$ do not have to be equal to each other. However, all three distances a, $a_1$ and $a_2$ must meet certain conditions to be explained below in connection with the operation of the test fixture 40.

A first probing element 63 is located and held in the first cavity 61, which cavity 61 is formed proximate to the aperture 54 such that a top portion 64 of the probing element 63 is proximate to the one end 58 of the double-ended probe 56. As shown, the probing element 63 has its top portion 64 adapted to contact the test point 44 of the circuit board 41. In accordance with an embodiment of the present invention, the probing element 63, which is made of an electrically conducting material, is inserted into the cavity 61 such that electrical contact is formed between the probing element 63 and the electrically conducting support body 51. Such insertion may include press fitting of the probing element 63 into the cavity 61 or using some well known bonding technique capable of achieving an electrical contact therebetween.

Similarly, a second probing element 66 is located and held in the second cavity 62, which cavity is formed proximate to the aperture 54 such that one portion 67 of the second probing element 66 is proximate to the other end 59 of the double-ended probe 56. As shown, the second probing element 66 has a portion 67 adapted to contact the electrical termination 47 of the connecting board 42. The holding of the second probing element 66 in the cavity 62 is achieved in a similar manner than that of the first probing element 63 into its corresponding cavity 61.

The support body 51 is insulated from the circuit board 41 by means of a first layer of insulating material 68 interposed between the major surface 52 of the support body 51 and the plated side of the board 41. As shown, the layer of insulating material 68 covers the major surface 52 except at the locations corresponding to those of the apertures 54 and of the first cavities 61 thereby enabling the end portions 58 and 64 of the probes 56 and probing elements 63 to contact the board 41. Similarly, on the opposite side of the support body 51, a layer of insulating material 69 covers the major surface 53 with the exception of the locations corresponding to those of the apertures 54 and of the second cavities 62 to enable the probing end portions 59 and 67 to contact the connecting board 42.

Various structural and operational details of the test fixture 40 are described hereafter in connection with a test operation of the circuit board 41. If the component 48 on the circuit board 41 is to be tested, an electrical test signal is injected from the test equipment (not shown) into line 49. Such a signal, schematically illustrated by the broken arrow line 71 propagates along line 49 and reaches the termination 46. Since the double-ended probe 56 contacts the termination 46, the electrical signal is coupled to the probe 56 and propagates along its longitudinal direction without coupling into the support body 51 due to the isolating spacer 57. The signal path in the probe 56 is illustrated by a broken arrow line 72. The electrical signal is next coupled to the test point 43 and is fed into the component under test 48 via its terminal lead 73. The signal which propagates along a path 74 in the component 48 is then coupled, via a return terminal lead 75 of the component, to the test point 44. The electrical signal enters the first probing element 63 at its end portion 64, propagates in the element 63 as shown by 76, couples into the support body 51 along its periphery as shown by broken lines 77, 78 and 79, and returns back to the test equipment via the second probing element 66, the termination 47 and the line 50.

The propagation of the electrical test signal in the conductive support body 51 is confined to a region proximate to the outer surfaces thereof. Maxwell's equations applied to the study of fields propagation and penetration into a conductor show that the magnitudes of the fields and current decrease exponentially with penetration into the conductor. Details of such phenomena are given, for example, in Section 4.12 entitled "Application of Maxwell's Equations; Penetration of Electromagnetic Fields into a Good Conductor" of a book by S. Ramo et al. "Fields and Waves in Communication Electronics", published by John Wiley, 1967, pages 249-254. A quantity often called depth of penetration or skin depth $\delta$, is the depth at which the fields and current decrease to $1/e$ (i.e., 37%) of their values at the surface of the conductor. The equation of the skin depth, $\delta$, is given by Ramo et al. at page 252 of their publication as:

$$\delta = \frac{1}{\sqrt{\pi f \mu \sigma}} \text{ meters} \qquad (1)$$

wherein
f is the frequency of the signal in Hz;
$\mu$ is the permeability of the conducting material in henry/meters; and
$\sigma$ is the bulk of electrical conductivity of the material in mhos/meter.

With the probing elements 63 and 66 physically separated and distant from each other by a predetermined distance a, the applied electrical test current is forced to follow in the body 51 an electrically conductive transmission loop comprising lines 77, 78 and 79 rather than penetrate across the bulk of the support body 51. The propagation of the current along lines 77, 78 and 79 is primarily confined within a depth, $\delta$, given by the above equation (1). Thus, in order to avoid a current coupling across the support body 51 between the first probing element 63 and the major surface 53 thereof, the distance $a_1$ must be selected to be larger than $\delta$ and preferably larger than or equal to $3\delta$. Indeed, it should be appreciated that the fields and current in the support body 51 do not fail to penetrate below the depth $\delta$; this being merely the point at which they have decreased to $1/e$ of their values at the surface. Similarly, the respective distances a and $a_2$ should also be larger than $\delta$ and preferably larger than or equal to $3\delta$. In other words, the respective depths $d_1$ and $d_2$ of the cavities 61 and 62 must be smaller than the thickness t by at least $3\delta$.

In accordance with an embodiment of the present invention, rather than having one continuous return probe extending through the support body (as is well known in prior art test fixtures), the physical separation of the probing elements 63 and 66 from each other contributes to a substantial reduction of the inductance of the circuit formed between the contact terminations 46 and 47. Such reduction in the industance of the test loop enables a substantially increased testing speed using test signals at frequencies substantially larger than those of conventional testing techniques.

Figure 2A:
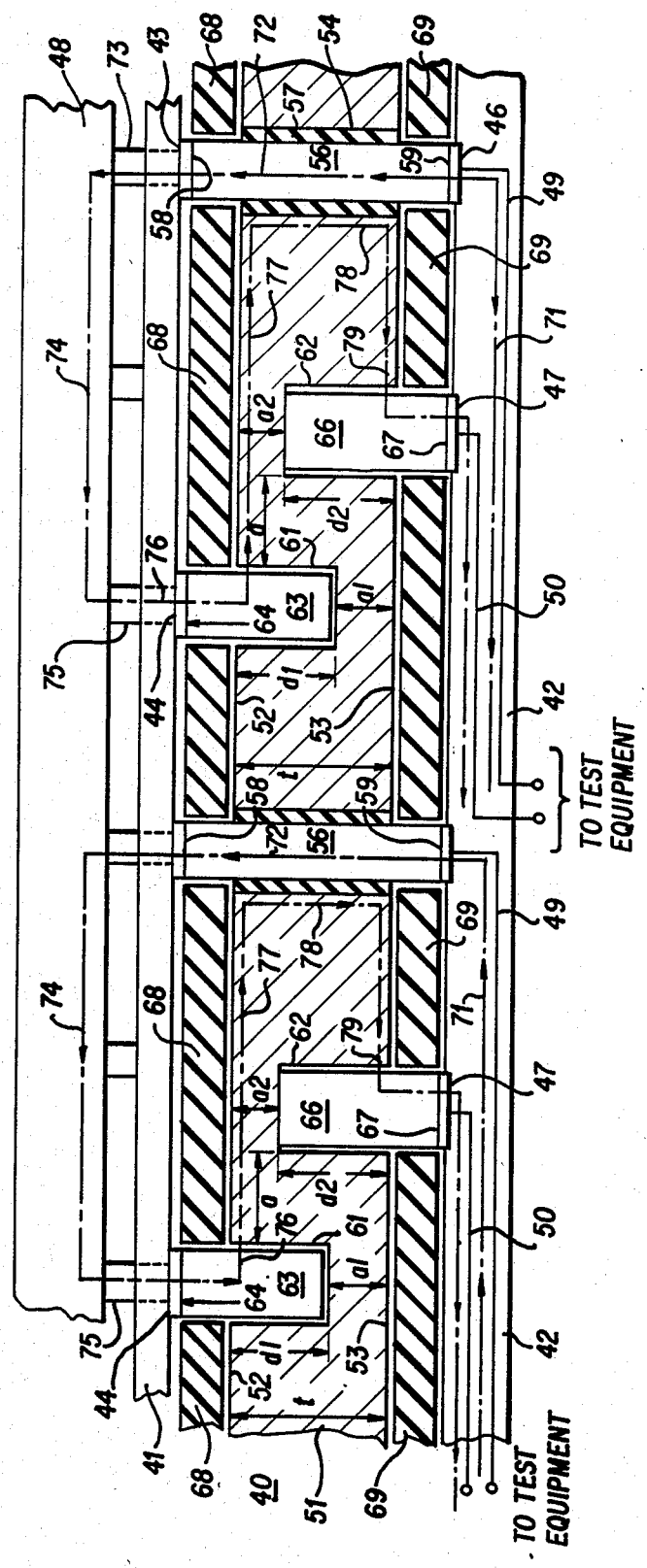
FIG. 2a shows a test fixture of the type illustrated in FIG. 2 having an array of probes and probing elements.

FIG. 2a shows a test fixture 40 constructed in the same manner as fixture 40 in FIG. 2, and therefore like numbers have been used to reference like elements. The test fixture 40 of FIG. 2a includes a plurality of probes 56—56 extending beyond opposed surfaces of an electrically conductive support body 51. A plurality of first and second probing elements 63—63 and 66—66, respectively, each extend from an opposed one of the surfaces of the body 51 so as to each be proximate to one of the ends of a separate one of the probes 56—56. Each of the probe elements 56—56 and the second probing elements 66—66 is connected via a separate one of lines 49—49 and 50—50, respectively, to the test equipment (not shown). Each of the first probing elements 63—63 is connected to each of the second probing elements 66—66 by way of a respective set of conductive paths 77, 78 and 79 proximate the opposed surfaces of the support body 51.

Shown in FIG. 3 is a test fixture 80 in accordance with another embodiment of the invention. Most elements of this test fixture 80 have identical reference numerals to the numerals of the test fixture 40 of FIG. 2 to illustrate the similarities of these two embodiments. The structure and operation of these identical elements will not be described again. The test fixture 80 comprises an insulating support body 81 having a pair of substantially parallel major surfaces 82 and 83. The body 81 may be made of any well known insulating material capable of being formed or shaped in a planar configuration. The support body 81 has arrays of cavities 61 and 62, and of apertures 54 formed therein in a similar way and shape than the cavities and apertures of the support body 51 of FIG. 2.

As shown in FIG. 3, a layer 84 made of conducting material is deposited on the major surfaces 82 and 83 of the insulating support body 81 and on the interior walls of all the first cavities 61, of all the second cavities 62 and of all the apertures 54. Thus, the serially-connected sections 86, 87 and 88 of the conducting layer 84 form a transmission loop connecting the first probing element 63 to the second probing element 66. The thickness dimension of the conducting layer 84 is selected on the basis of the above-discussed conditions in connection with the embodiment of FIG. 2. The positioning of the cavities 61 and 62 is chosen to insure isolation of the probing elements 63 and 66 with the insulating body 81 positioned therebetween.

Figure 3A:
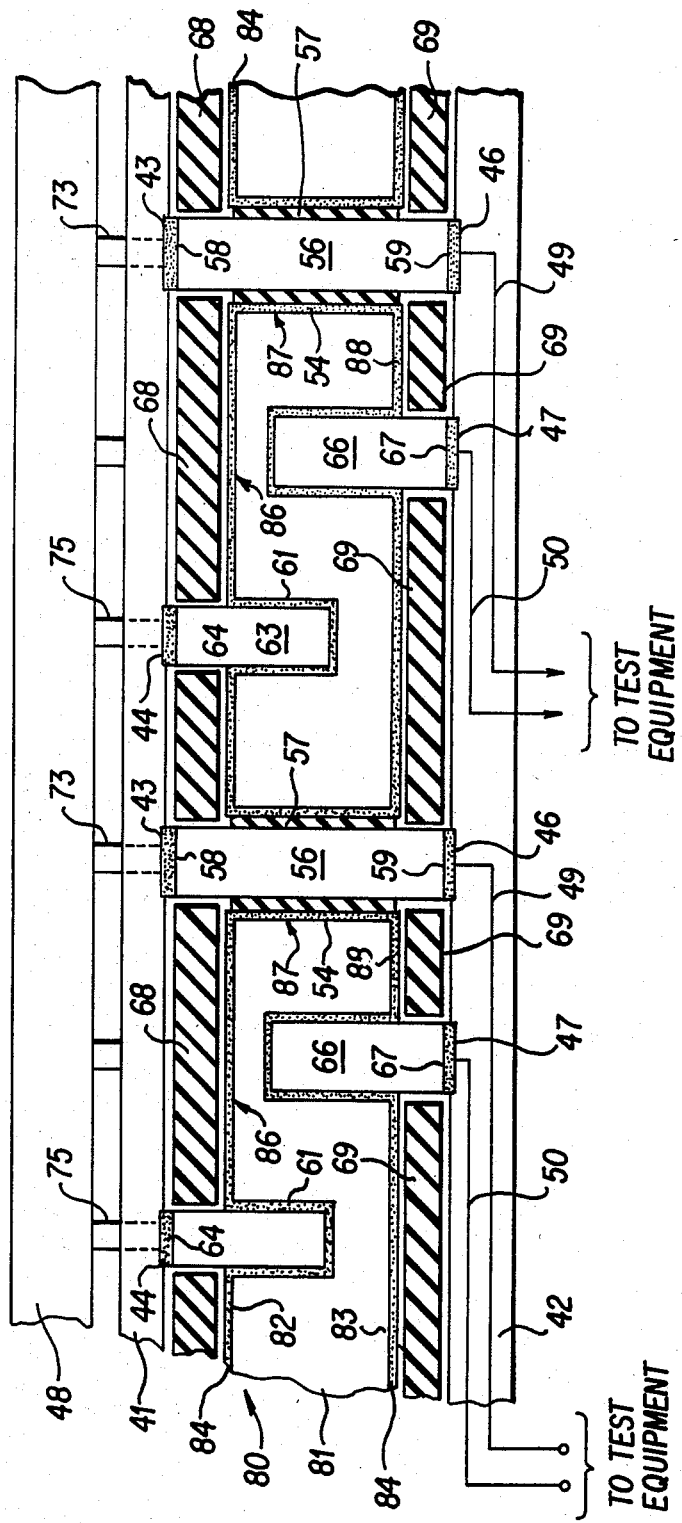
FIG. 3a shows a test fixture of the type illustrated in FIG. 3 having an array of probes and probing elements.

FIG. 3a shows a test fixture 80 constructed in the same manner as test fixture 80 of FIG. 3 and therefore like numbers have been used to reference like elements. The fixture 80 of FIG. 3a includes a plurality of probes 56—56 extending beyond opposed electrically conductive surfaces 82 and 83 on support body 81. A plurality of first and second probing elements 63—63 and 66—66, respectively, each extend from a separate one of the opposed surfaces on the support body 81 so as to be proximate to one of the ends of the probes 56—56. Each of the probes 56—56 and each of the second probing elements 66—66 is connected via a separate one of lines 49—49 and 50—50, respectively, to the test equipment (not shown). Each of the first probing elements 63—63 is connected to each of the second probing elements 66—66 via the conductive surfaces 86, 87 and 88 on the support body 81.

Figure 4:
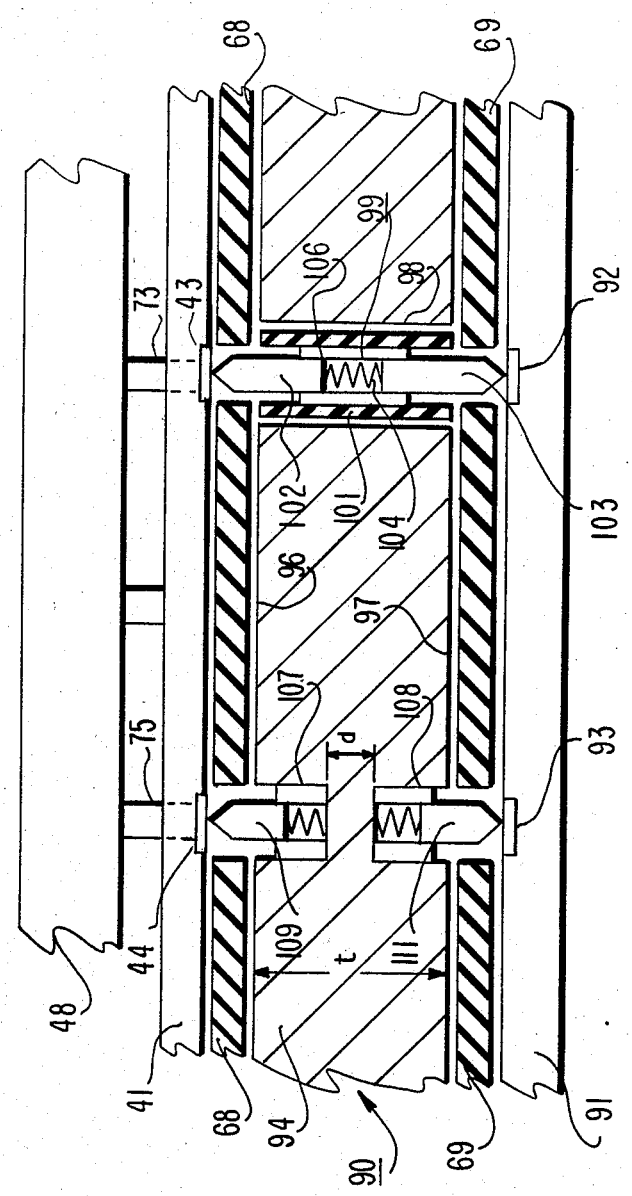
FIG. 4 shows a portion of a test fixture in accordance with a preferred embodiment of the present invention.

A preferred embodiment of the present invention is shown in FIG. 4 wherein a test fixture 90 is interposed between the circuit board to be tested 41 and a connecting board 91 coupled to a test equipment (not shown). The test fixture 90 is used as the electrical interface to establish electrical connections between the test points 43 and 44 of the circuit board 41 under test and electrical terminations (e.g., 92 and 93) of the connecting board 91.

The test fixture 90 comprises an electrically conducting support body 94 having a pair of substantially parallel major surfaces 96 and 97. The support body 94, which is positioned between the circuit board 41 and the connecting board 91, is preferably a planar metallic body (e.g., aluminum) having a thickness, t, of the order of 0.5 to 1 inch and overall dimensions of its two major surfaces 96 and 97 comparable to those of the boards 41 and 91.

The electrically conductive support body 94 comprises an array of apertures extending between its two major surfaces 96 and 97. For purpose of illustration, only one aperture 98 of the array of apertures is shown in FIG. 4. The aperture 98 is adapted to receive and hold therein a double-ended spring-loaded test pin 99 which is part of an array of test pins of the test fixture 90. A spacer 101, made of insulating material, is inserted in the aperture 98 to isolate the double-ended test pin 99 from the conducting support body 94. The double-ended spring-loaded test pin 99 includes two elongated pointed members 102 and 103 having a spring 104 positioned therebetween, and held within a housing 106.

The support body 94 further comprises a set of first cavities 107 formed in its major surface 96 and a set of second cavities 108 formed in its other major surface 97. As mentioned in connection with the array of apertures 98, only one cavity of each set of first and second cavities is shown in FIG. 4. However, it should be understood that the support body 94 in this preferred embodiment of the invention comprises an array of cavities 107 and 108 formed therein. In accordance with this preferred embodiment, the cavities 107 and 108 are in substantial axial alignment with each other. As shown in FIG. 4, the cavities 107 and 108 do not extend through the entire thickness, t, of the support body 94 but are maintained at a predetermined distance, d, from each other. It should be noted that the respective depths of the cavities 107 and 108 do not have to be equal to each other.

A first spring-loaded test pin 109 is located and held in the first cavity 107, which cavity 107 is formed proximate to the aperture 98 such that a pointed tip of the pin 109 is proximate to the one end of the double-ended spring-loaded test pin 99. As shown, the test pin 109 has its pointed tip adapted to contact the test point 44 of the circuit board 41. The test pin 109 which is made of an electrically conducting material is inserted into the cavity 107 such that electrical contact is formed between the test pin 109 and the electrically conducting support body 94. Such insertion may include press fitting of the test pin 109 into the cavity 107 or using some well known bonding technique capable of achieving an electrical contact therebetween.

Similarly, a second spring-loaded test pin 111 is located and held in the second cavity 108, which cavity is formed in the opposite major surface 97 in axial alignment with the first cavity 107. As shown, the second spring-loaded test pin 111 has its pointed tip adapted to contact the electrical termination 93 of the connecting board 91. The holding of the second test pin 111 in the cavity 108 is achieved in a similar manner than that of the first test pin 109 into its corresponding cavity 107.

As mentioned above in connection with the embodiments shown in FIGS. 2 and 3, the support body 94 is insulated from the circuit board 41 by means of a first layer of insulating material 68 interposed between the major surface 96 of the support body 94 and the plated side of the board 41. As shown, the layer of insulating material 68 covers the major surface 96 except at the locations corresponding to those of the apertures 98 and of the first cavities 107 thereby enabling the pointed tips of the test pins 99 and 109 to contact the board 41. Similarly, on the opposite side of the support body 94, a layer of insulating material 69 covers the major surface 97 with the exception of the locations corresponding to those of the apertures 98 and of the second cavities 108.

As already mentioned in connection with the embodiment of FIG. 2, the axial distance d between the two cavities 107 and 108 is selected to be equal to or larger than 3δ, with δ defining the skin depth or depth of penetration of the test signal into the conducting support body 94. The current paths in the test fixture 90 during a testing operation are comparable to those described in connection with the above-described test fixtures 40 and 80 of FIGS. 2 and 3, respectively.

FIG. 4a shows a test fixture 90 constructed in the same manner as the test fixture 90 of FIG. 4 and therefore like numbers have been used to reference like elements. The fixture 90 of FIG. 4a includes a plurality of double ended spring loaded test pins 99—99 each extending beyond opposed surfaces of an electrically conductive support body 94. A plurality of first and second spring loaded test pins 109—109 and 111—111, respectively, each extend from a separate one of the opposed surfaces of the support body 94 so as to be proximate to one of the ends of a separate one of the double-ended pins 99—99. Each of the double-ended test pins 99—99 and each of the second spring-loaded test pins 111—111 is connected to a separate one of electrical terminations 92—92 and 93—93, respectively. Each of the first spring-loaded test pins 109—109 is connected to each of the second test pins 111—111 via the conductive surfaces 96 and 97 of the support body 94.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A test fixture comprising:
   a support body having first and second substantially parallel, electrically conductive major surfaces in electrical contact with each other;

a double-ended probe extending through said support body beyond said first and second major surfaces thereof, said probe being insulated from first and second surfaces;

a first probing element in electrical contact with, and extending from said first major surface so as to be positioned proximate to one end of the double-ended probe;

a second probing element in electrical contact with and extending through said second major surface so as to be positioned proximate to the other end of the double-ended probe; and the first and second probing elements are electrically interconnected to each other by said first and second major surfaces which serve to pass a high frequency signal therealong between the first and second probing elements.

2. A test fixture according to claim 1, wherein the support body comprises an electrically conducting planar body.

3. A test fixture according to claim 2, further including:

a first cavity formed in the first major surface of the body for holding the first probing element;

a second cavity formed in the second major surface of the body for holding the second probing element, each cavity having a depth smaller than the thickness of the body between the first and second major surfaces thereof;

an aperture extending through the thickness of the body for holding the double-ended probe; and means located within said aperture for isolating the double-ended probe from the conducting planar body.

4. A test fixture according to claim 3, further including:

first dielectric means covering the area of the first major surface of the conducting body between the one end of the double-ended probe and the first probing element; and second dielectric means covering the area of the second major surface of the conducting body between the other end of the double-ended probe and the second probing element.

5. A test fixture comprising:

a support body having first and second substantially parallel, electrically conductive major surfaces in electrical contact with each other;

an array of double-ended probes extending from said support body beyond said first and second major surfaces thereof each double-ended probe being electrically insulated from each of said first and second major surfaces;

a plurality of first probing elements each in electrical contact with, and extending from said first major surface so as to each be positioned proximate to one end of a separate one of the double-ended probes;

a plurality of second probing elements in electrical contact with, and extending from said second major surface so as to each be positioned proximate to the other end of a separate one of the double-ended probes; and each of the first and second plurality of probing elements is electrically interconnected to the other by the first and second major surfaces which serve to pass a high frequency signal therealong between the respective first and second probing elements.

6. A test fixture according to claim 5, wherein the support body comprises an electrically conducting planar body.

7. A test fixture according to claim 6, further including:

a plurality of first cavities formed in the first major surface of the body for holding the plurality of first probing elements;

a plurality of second cavities formed in the second major surface of the body for holding the plurality of second probing elements, each one of said first and second cavities having a depth smaller than the thickness of the body between the first and second major surfaces thereof;

a plurality of apertures extending through the thickness of the body for holding the array of double-ended probes; and means located within each one of said plurality of apertures for isolating the double-ended probes from the conducting planar body.

8. A test fixture according to claim 7, further including:

first dielectric means covering the area of the first major surface of the conducting body between the one ends of the double-ended probes and the first probing elements; and second dielectric means covering the area of the second major surface of the conducting body between the other ends of the double-ended probes and the second probing elements.

9. A test fixture according to claim 8 wherein:

said one ends of the probes and said first probing elements are adapted to contact test points of a circuit board under test; and said other ends of the probes and said second probing elements are adapted to contact electrical terminations of a connecting board coupled to a test equipment.

10. A test fixture according to claim 5, wherein the support body comprises a planar body made of insulating material.

11. A test fixture according to claim 10, further including:

a plurality of first cavities formed in the first major surface of the body for holding the plurality of first probing elements;

a plurality of second cavities formed in the second major surface of the body for holding the plurality of second probing elements, each one of said first and second cavities having a depth smaller than the thickness of the body between the first and second major surfaces thereof; and a plurality of apertures extending through the thickness of the body for holding the array of double-ended probes.

12. A test fixture according to claim 11, further including:

electrically conductive means deposited on the interior walls of said first cavities, said second cavities and said apertures so as to make contact with said first and second major surfaces; and means located within each one of said plurality of apertures for isolating the double-ended probes from the first and second major surfaces.

13. A test fixture according to claim 12, further including:

first dielectric means covering the conducting area of the first major surface of the body between the one ends of the double-ended probes and the first probing elements; and second dielectric means covering the conducting area of the second major surface of the body between the other ends of the double-ended probes and the second probing elements.

14. A test fixture comprising:

a support body having first and second substantially parallel, electrically conductive major surfaces in electrical contact with each other;

an array of double-ended spring-loaded test pins extending through said support body beyond said first and second major surfaces thereof, said double-ended pins being insulated from said first and second major surfaces;

a plurality of first spring-loaded test pins in electrical contact with, and extending from said first major surface so as to each be positioned proximate to one end of a separate one of the double-ended spring-loaded test pins;

a plurality of second spring-loaded test pins in electrical contact with, and extending from said second major surface so as to each be positioned proximate to the other end of a separate one of the double-ended spring-loaded test pins; and each of the first and second plurality of pins being electrically interconnected to the other by the first and second major surfaces which serve to pass a high frequency signal therealong between the respective first and second pins.

15. A test fixture according to claim 14, wherein the support body comprises an electrically conducting planar body.

16. A test fixture according to claim 15, further including:

a plurality of first cavities formed in the first major surface of the body for holding the plurality of first spring-loaded test pins;

a plurality of second cavities formed in the second major surface of the body for holding the plurality of second spring-loaded test pins, each one of said first and second cavities having a depth smaller than the thickness of the body between the first and second major surfaces thereof;

a plurality of apertures extending through the thickness of the body for holding the array of double-ended spring-loaded test pins; and means located within each one of said plurality of apertures for isolating the double-ended spring-loaded test pins from the conducting planar body.

17. A test fixture according to claim 16, further including:

first dielectric means covering the area of the first major surface of the conducting body between the one ends of the double-ended test pins and the first spring-loaded test pins; and second dielectric means covering the area of the second major surface of the conducting body between the other ends of the double-ended test pins and the second spring-loaded test pins elements.

18. A test fixture comprising:

an electrically conducting planar body having a first and a second major surface;

an array of double-ended spring-loaded test pins held in apertures through the planar body and extending beyond and, insulated from said first and said second major surface;

a first plurality of spring-loaded test pins positioned in first cavities formed in said first major surface of the planar body; and a second plurality of spring-loaded test pins positioned in second cavities formed in said second major surface of the planar body in substantial axial alignment with said first cavities, said first and second cavities having a combined depth smaller than the thickness of the planar body between its two major surfaces such that high frequency signals will pass between the first and the second spring-loaded test pins substantially along the first and second major surfaces of said body.

19. A test fixture according to claim 18, further comprising means located within said apertures for isolating the double-ended spring-loaded test pins from the planar body.

20. A test fixture according to claim 19, further comprising first and second insulating layers respectively deposited on said first and second major surfaces.

21. A high frequency in-circuit test fixture comprising:

a support body having first and second electrically conductive major surfaces in electrical contact with each other;

an array of double-ended spring-loaded back drive pins extending beyond and insulated from the support body;

a plurality of first spring-loaded pins each positioned in a separate one of a plurality of first cavities formed in the first major surface of the support body so as to be in electrical contact therewith;

a plurality of second spring-loaded pins oppositely positioned to said first ground pins in a plurality of second cavities formed in the second major surface of the support body so as to be in electrical contact therewith; and each of the first and second plurality of spring loaded pins is interconnected to each other by the first and second major surfaces which serve to pass a high frequency signal therealong between respective first and second spring-loaded pins.

22. A method for testing a circuit board by connecting test points on the circuit board to electrical contact terminations of a connecting board, the method comprising the steps of:

positioning a planar support body having first and second major electrically conductive surfaces in electrical contact with each other between said circuit board and said connecting board;

contacting a test point on the circuit board with one end of a double-ended probe extending through the support body and isolated from the first and second major surfaces thereof;

contacting another test point with a first probing element in electrical contact with, and extending from the first major surface of the support body;

contacting the other end of the double-ended probe with one electrical contact termination of the connecting board;

contacting another electrical contact termination of the connecting board with a second probing element in electrical contact with and extending from the second major surface of the support body; and coupling a test signal between said one and said another electrical contact terminations so that said signal is transmitted along said first and second major surfaces of support body between said first and said second probing element.

* * * * *